Aug. 31, 1965 J. W. BATTIN 3,204,202

AMPLIFIER CONTROL CIRCUIT

Filed June 10, 1960

INVENTOR.
John W. Battin
BY Mueller & Aichele
Attys.

United States Patent Office 3,204,202
Patented Aug. 31, 1965

3,204,202
AMPLIFIER CONTROL CIRCUIT

John W. Battin, Addison, Ill., assignor to Motorola, Inc., Chicago, Ill., a corporation of Illinois Filed June 10, 1960, Ser. No. 35,346
4 Claims. (Cl. 332—18)

Figure 1:
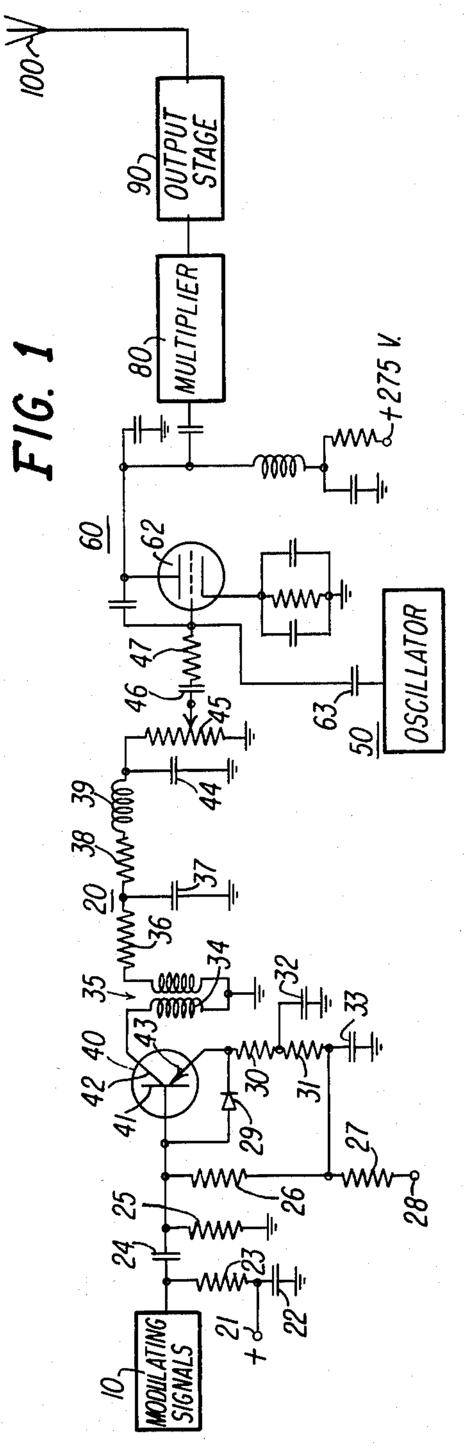

This invention relates generally to audio frequency compression system and more particularly to a system which provides instantaneous frequency deviation control in phase modulation transmitters by compressing the modulating signal applied thereto.

This invention is directed to an improvement in the circuit disclosed in Macdonald et al. Patent 2,759,052 wherein instantaneous frequency deviation control is provided by compressing the audio signal which is applied to the modulator of a phase modulation transmitter. The present invention is directed to circuit improvements which have been found to provide better operation under certain conditions.

Since a transistor is used in the signal compression circuit, the inherent susceptibility of the transistor to high ambient temperature change may cause unstable biasing of the compression circuit. Also, distortion may become a problem in the signal compression circuit and the power output of the prior circuit is decreased with a high signal level input. Another problem is the high delay time required to actuate the signal compression circuit when a transmitter is used which is frequently turned on and off. Such delay time sometimes results in the loss of the first several words spoken during transmission.

Thus, it is an object of the present invention to provide an improved audio signal compression circuit which provides instantaneous frequency deviation control.

Another object of the present invention is to provide an audio signal compression circuit having relatively constant output voltage, thereby adding stability to the circuit.

Another object of the present invention is to provide an audio signal compression circuit including a transistor which has improved stability over a wide range of ambient temperatures and over a wide range of input signal levels.

A feature of the invention is the provision of an audio signal compression circuit which utilizes a transistor and a semiconductor diode having its anode connected to the base electrode of the transistor and its cathode connected to the emitter electrode of the transistor in such circuit.

Another feature of the invention is the provision of an audio signal compression circuit having a resistor connected in the emitter circuit of a transistor and providing negative feedback in the transistor circuit for reduced distortion of the output signal.

Still another feature of the invention is the provision of an audio compression circuit having a transistor and an audio transformer having its primary winding connected to the collector electrode of the transistor, such transformer being characterized by low primary impedance and providing a voltage step-up for matching to a tube in the modulator circuit.

Figure 2:
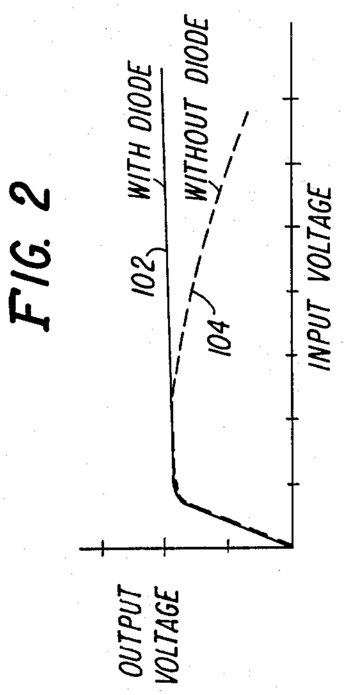

In the drawings:

FIG. 1 is a combined block and schematic diagram of a radio transmitter circuit wherein the invention is incorporated; and FIG. 2 is a graph plot showing the improved output voltage characteristics of a compression circuit of FIG. 1.

In practicing the invention, there is provided an audio signal compression circuit which may be used in a phase modulation radio transmitter to limit the frequency deviation of such transmitter. The modulating signal may be any low frequency signal such as an audio signal obtained from a microphone. The modulating signal is applied to a differentiating circuit which may include a capacitor and a resistor, with the differentiated signal appearing across the resistor. The differentiated signal may then be applied to a transistor stage which amplifies and limits the signal through symmetrical clipping of both the negative and positive portions of the waves. A semiconductor diode is connected between the base and emitter electrodes of the transistor with a polarity opposite to that between the base and emitter electrodes. This provides stable output voltage at the collector electrode and causes relatively instantaneous operation of the transistor when transmission begins. An unbypassed resistor is connected in the emitter circuit of the transistor and provides negative feedback to the transistor to reduce distortion therein. The output at the collector of the transistor may be applied to a transformer having a low primary impedance winding and which provides a voltage step-up to match the tube of the modulator circuit. The signal across the transformer secondary winding is applied to an integrating circuit which restores the modulating wave for values below the clipping level and which rounds the clipped waves resulting from steep slopes of the signal. The restored signal is applied to the modulator stage for modulating a carrier wave which is transmitted.

Referring now to the drawings, in FIG. 1 a source of modulating signals 10 is provided which may be a microphone providing voice signals. The modulating signals are applied to circuit 20 including an input circuit formed by resistor 23 and capacitor 22 which provide a circuit for applying a voltage from terminal 21 to the microphone. The modulating signal is applied to capacitor 24 and resistor 25 which form a differentiating circuit with a voltage being developed across resistor 25 and applied to base 41 of transistor 40 which varies with the rate of change of the audio signal.

Operating bias for transistor 40 is provided from B+ terminal 28 through a voltage divided including resistors 25, 26 and 27. The positive potential across resistor 25 is applied to the base 41 from the voltage divider. Positive bias is also applied from the divider to emitter 43 through resistor 31 and resistor 30. The biases applied to transistor 40 are adjusted so that clipping or limiting of the signal occurs when the signal level exceeds a predetermined value. Capacitor 32 is an emitter signal bypass capacitor connected between ground and one end of resistor 31 which provides temperature stability to transistor 40. Capacitor 33 is a decoupling capacitor.

Resistor 30 connected to emitter 43 is not bypassed so that the emitter signal must flow through this resistor. This resistor has a value to provide negative feedback to transistor 40 and this acts to reduce distortion therein.

Diode 29 is connected between emitter 43 and base 41 and has a polarity for conduction opposite to that of the base and emitter electrodes. This diode accomplishes two important features, one of which is to stabilize the operating point of transistor 40 with high level input. If diode 29 were not in the circuit capacitor 32 would receive a negative charge through the base-emitter junction of transistor 40 when large signals are applied. The collector-emitter voltage of transistor 40 would therefore be decreased thereby resulting in decreased output. The effect of diode 29 may be seen in FIG. 2 where output voltage is plotted on the ordinate and input voltage is plotted along the abscissa. The solid line 102 shows output voltage of the transistor when the diode is used and line 104 shows output voltage of the transistor circuit without the diode. Also, when diode 29 is in the circuit, capacitor 32 receives a negative voltage pulse through transistor 40 and a positive voltage pulse through diode 29. The net charge is substantially zero and the voltage of emitter 43 remains constant for high level input signals.

The other feature of diode 29 is to eliminate the time delay of the signal compression circuit when the transmitter is turned on by the application of the B+ voltage. Thus, if diode 29 is not in the circuit, capacitor 32 is charged through resistor 31. Capacitor 32 should have large capacitance to be a good A.C. bypass at low audio frequencies and resistor 31 should be relatively large to maintain good temperature characteristics. However, the values of capacitor 32 and resistor 31 create a time delay constant which causes transistor 40 to be cutoff for a duration of time which might cause the first several words to be missed during transmission. When the anode of diode 29 is connected to base 41 and the cathode of diode 29 is connected to emitter 43, capacitor 32 charges through resistor 26 and resistor 30, thereby reducing the time delay constant by a factor of approximately ten. During normal low signal level operation, diode 29 is biased in the reverse direction and has no effect on circuit operation.

The output signal at collector 42 is applied to transformer 35 having low impedance primary winding 34. The transformer has a turns ratio to provide a step-up voltage for the modulator tube and to match the input impedance thereof. Resistor 36 and capacitor 37 form an integrating circuit wherein the voltage across capacitor 37 varies with the rate of change of the voltage applied to the integrating circuit. This restores the modulating signal at low levels where no clipping takes place. In instances where the differentiated signal has high amplitude so that it is clipped by the transistor stage to form a square wave, the square wave is rounded and the tendency for distortion is reduced. Resistor 38, inductor 39, capacitor 44 and potentiometer 45 form an output filter for the control circuit. Potentiometer 45 is adjustable so that the level of the modulating signal derived therefrom may be controlled thereby.

The compressed modulating signal is applied through coupling capacitor 46 and resistor 47 to the control grid of tube 62 of the modulator circuit. Oscillator 50 provides the carrier wave which is applied to the control grid of modulator tube 62 through capacitor 63. The modulator circuit operates in a known manner. The output from modulator 60 is applied to a multiplier 80 which may include a plurality of stages in which the frequency of the modulated carrier wave is multiplied before being applied to output stage 90. Output stage 90 provides waves of the desired power level which are radiated from transmitter antenna 100.

In a circuit which operated satisfactorily in accordance with the invention the following circuit elements were used.

| | |
|---|---|
| Capacitor 22 | 15 microfarads. |
| Resistor 23 | 270 ohms. |
| Capacitor 24 | .15 micromicrofarad. |
| Resistor 25 | 1000 ohms. |
| Resistor 26 | 1500 ohms. |
| Resistor 27 | 37 ohms. |
| Diode 29 | Type 1N461. |
| Resistor 30 | 68 ohms. |

| | |
|---|---|
| Resistor 31 | 12,000 ohms. |
| Capacitor 32 | 15 microfarads. |
| Capacitor 33 | 4.7 microfarads. |
| Transformer 35 | Primary 1020 ohms, secondary 7100 ohms. |
| Resistor 36 | 180,000 ohms. |
| Capacitor 37 | 3300 micromicrofarads. |
| Resistor 38 | 22,000 ohms. |
| Choke 39 | 6 henries. |
| Transistor 40 | Type 2N652. |
| Capacitor 44 | 390 micromicrofarads. |
| Potentiometer 45 | 200,000 ohms. |
| Capacitor 46 | 2000 micromicrofarads. |
| Resistor 47 | 227,000 ohms. |
| Tube 62 | Type 7060. |
| Capacitor 63 | 27 micromicrofarads. |

Thus, the invention provides an improved audio signal compression circuit which includes a transistor and a semiconductor diode connected between the base and emitter of the transistor. A resistor in the emitter circuit of the transistor provides negative feedback thereby reducing distortion in the output signal of the transistor. The circuit provides stability for all input signal levels, low distortion, and is not susceptible to high ambient temperature changes.

I claim:

1. A combined amplifying and limiting transistor stage for audio signals including in combination, a transistor having base, emitter, and collector electrodes, a semiconductor diode connected between said base and emitter electrodes and poled for conduction from said base electrode to said emitter electrode, input signal means coupled to said base electrode for applying audio frequency signals thereto, means including an unbypassed resistor connected between said emitter electrode and a reference potential, the audio frequency current through said emitter electrode flowing through said resistor to provide negative feedback action in said transistor stage for audio frequency signals, means providing operating potentials to said electrodes, and an output circuit including a transformer having a primary winding connected to said collector electrode, said transformer providing voltage step-up and impedance matching from said collector electrode for a high impedance output.

2. An audio signal amplifying and limiting transistor stage including in combination, a transistor having base, emitter and collector electrodes, a semiconductor diode connected between said base and emitter electrodes and poled for conduction from said base to said emitter, means providing operating potentials to said electrodes of said transistor and including first and second resistors connected in series from said emitter electrode to a reference potential, capacitor means connected from the junction of said first and second resistors to said reference potential thereby providing an alternating current bypass for said second resistor, input signal means coupled to said base electrode, and an output circuit including a transformer having a primary winding connected to said collector electrode, said first resistor passing the signals to said emitter electrode and being unbypassed to provide negative feedback to reduce distortion in the signal at said collector electrode, said semiconductor diode providing a charge to said capacitor means to oppose the charge applied thereto by said transistor to stabilize the stage at high signal levels.

3. An audio signal amplifying and limiting transistor stage including in combination, a transistor having base, emitter and collector electrodes, a semiconductor diode connected between said base and emitter electrodes and poled for conduction from said base electrode to said emitter electrode, means for applying audio frequency signals to said base electrode, and means providing operating potentials to said electrodes including unbypassed resistor means connected to said emitter electrode, said resistor means forming the sole path for audio frequency signals from said emitter electrode and providing negative feedback at audio frequencies so that distortion is reduced in an audio output signal at said collector electrode.

4. An audio signal amplifying and limiting transistor stage including in combination, a transistor having base, emitter and collector electrodes, a semiconductor diode connected between said base and emitter electrodes and poled for conduction from said base electrode to said emitter electrode, means providing operating potentials to said electrodes including first and second resistor means connected to said emitter electrode, and capacitor means connected from the junction of said first and second resistor means to a reference potential and providing a bypass for said second resistor means, the emitter current of said transistor flowing through said first resistor means, which is unbypassed to provide negative feedback, said semiconductor diode providing a charge to said capacitor means to oppose the charge applied thereto by said transistor to stabilize said stage at high signal levels.

References Cited by the Examiner

UNITED STATES PATENTS

| | | | |
|---|---|---|---|
| 2,759,052 | 8/56 | Macdonald et al. | 307—88.5 |
| 2,874,312 | 2/59 | Radcliffe et al. | 307—88.5 |
| 2,939,000 | 5/60 | Kurgman | 331—109 X |
| 2,992,399 | 7/61 | Van Tassel et al. | 307—88.5 |

ROY LAKE, *Primary Examiner.*

L. MILLER ANDRUS, ROBERT H. ROSE, *Examiners.*